United States Patent
Cheng et al.

(10) Patent No.: US 12,081,232 B2
(45) Date of Patent: Sep. 3, 2024

(54) DIGITAL-TO-ANALOG CONVERSION DEVICE AND OPERATION METHOD THEREOF

(71) Applicant: Novatek Microelectronics Corp., Hsinchu (TW)

(72) Inventors: Jhih-Siou Cheng, New Taipei (TW); Chih-Hsien Chou, Hsinchu (TW); Chieh-An Lin, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 113 days.

(21) Appl. No.: 17/827,822

(22) Filed: May 30, 2022

(65) Prior Publication Data

US 2023/0387937 A1    Nov. 30, 2023

(51) Int. Cl.
*H03M 1/66* (2006.01)
*G09G 3/20* (2006.01)

(52) U.S. Cl.
CPC .......... *H03M 1/661* (2013.01); *G09G 3/2007* (2013.01); *G09G 2310/027* (2013.01); *G09G 2310/0289* (2013.01)

(58) Field of Classification Search
CPC ........ H03M 1/66; H03M 1/742; H03M 1/765; H03M 1/001; H03M 1/0626; H03M 1/0682; H03M 1/1052; H03M 1/12; H03M 1/362; H03M 1/38; H03M 1/48; H03M 1/68; H03M 1/682; H03M 1/687; H03M 1/74; H03M 1/745; H03M 1/804; H03M 3/042; G09G 2310/027; G09G 2310/0291;

(Continued)

(56) References Cited

U.S. PATENT DOCUMENTS 4,779,013 A * 10/1988 Tanaka ............. H03K 19/00361
327/170
5,323,159 A *  6/1994 Imamura ................. H03M 1/68
341/145

(Continued)

FOREIGN PATENT DOCUMENTS

TW      201732764      9/2017
TW      202105346      2/2021
TW      M613921        7/2021

OTHER PUBLICATIONS

"Office Action of Taiwan Counterpart Application", issued on Jun. 26, 2023, p. 1-p. 4.

*Primary Examiner* — Linh V Nguyen

(74) *Attorney, Agent, or Firm* — JCIPRNET

(57) ABSTRACT

The disclosure provides a digital-to-analog conversion device and an operation method thereof. The digital-to-analog conversion device includes a digital-to-analog conversion circuit and a slew rate enhancement circuit. The digital-to-analog conversion circuit is configured to convert a digital code into an analog voltage. An output terminal of the digital-to-analog conversion circuit outputs the analog voltage to a load circuit. A control terminal of the slew rate enhancement circuit is coupled to the digital-to-analog conversion circuit to receive a control voltage following the analog voltage. The slew rate enhancement circuit is coupled to the output terminal of the digital-to-analog conversion circuit. The slew rate enhancement circuit enhances the slew rate at the output terminal of the digital-to-analog conversion circuit based on the control voltage.

24 Claims, 10 Drawing Sheets

(58) Field of Classification Search
CPC ....... G09G 2310/08; G09G 2310/0289; G09G 2330/021; G09G 3/3688; G09G 1/08; G09G 2300/0842; G09G 2310/0248; G09G 2310/0286; G09G 2310/066; G09G 2320/0219; G09G 2320/0223; G09G 2320/0252; G09G 2320/0285; G09G 2320/0673; G09G 2370/04; G09G 2370/10; G09G 3/20; G09G 3/2003; G09G 3/2011; G09G 3/2074; G09G 3/3266; G09G 3/36; G09G 3/3685
USPC .......................... 341/118–121, 135–136, 144
See application file for complete search history.

(56) References Cited

U.S. PATENT DOCUMENTS

| | | | |
|---|---|---|---|
| 7,768,433 | B2 | 8/2010 | Mathe et al. |
| 7,808,468 | B2* | 10/2010 | Son ...................... H03K 17/165 |
| | | | 345/98 |
| 9,541,974 | B1* | 1/2017 | Presti .................. H02M 3/1584 |
| 9,614,506 | B1* | 4/2017 | DiRenzo .................. H03K 5/12 |
| 11,288,994 | B2 | 3/2022 | Wang et al. |
| 2014/0285537 | A1* | 9/2014 | Kimura ................ G09G 3/3291 |
| | | | 345/77 |
| 2018/0019758 | A1* | 1/2018 | Hsiao .................... H03F 3/3035 |
| 2018/0104468 | A1* | 4/2018 | Marnfeldt ............... H03M 1/74 |
| 2019/0123692 | A1* | 4/2019 | Dempsey .................. H03F 1/42 |
| 2022/0013052 | A1 | 1/2022 | Wang et al. |
| 2022/0051606 | A1 | 2/2022 | Kim et al. |
| 2022/0084453 | A1* | 3/2022 | Pyun .................... G09G 3/2011 |
| 2022/0122542 | A1* | 4/2022 | Kim ..................... G09G 3/2074 |
| 2023/0206801 | A1* | 6/2023 | Cheng ...................... G09G 3/20 |
| | | | 345/212 |

* cited by examiner

DIGITAL-TO-ANALOG CONVERSION DEVICE AND OPERATION METHOD THEREOF

BACKGROUND

Technical Field

The disclosure relates to an electronic circuit, and more particularly relates to a digital-to-analog conversion device and an operation method thereof.

Description of Related Art

FIG. 1 is a schematic circuit block diagram of a channel circuit 10 of a conventional source driver. The channel circuit 10 shown in FIG. 1 includes a digital-to-analog converter (DAC) 11 and an output buffer 12. The output terminal of the output buffer 12 is coupled to a data line 21 of a display panel 20. The output terminal of the DAC 11 is directly coupled to the input terminal of the output buffer 12 via a metal line 13. The DAC 11 can convert a digital code D11 into an analog voltage, and output the analog voltage to the output buffer 12 via the metal line 13. The output buffer 12 can output a driving signal corresponding to the analog voltage to the data line 21 of the display panel 20.

After the analog voltage output by the DAC 11 transitions, it takes a certain period of time for the signal level of the metal line 13 to restore stability (transition to a new level). Generally speaking, the metal line 13 has a parasitic capacitance (trace capacitance) C13, and the input terminal of the output buffer 12 also has a parasitic capacitance (input capacitance) C12. The parasitic capacitances C12 and C13 are one of the factors that determine the slew rate at the output terminal of the DAC 11. However, the thrust (driving capability) of the DAC 11 is limited. As the operating frequency of the display panel 20 gets higher and higher, the thrust of the DAC 11 often fails to meet the design requirement of the slew rate.

It should be noted that the content of the "Related Art" section is to help understand the disclosure. Some (or all) of the content disclosed in the "Related Art" section may not be known to people having ordinary knowledge in the art. The content disclosed in the "Related Art" section does not mean that the content has been known to people having ordinary knowledge in the art before the filing of the present application.

SUMMARY

The disclosure provides a digital-to-analog conversion device and an operation method thereof which enhance/improve the slew rate at an output terminal of a digital-to-analog conversion circuit.

According to an exemplary embodiment of the disclosure, the digital-to-analog conversion device includes a digital-to-analog conversion circuit and a slew rate enhancement circuit. The digital-to-analog conversion circuit is configured to convert a digital code into an analog voltage. An output terminal of the digital-to-analog conversion circuit outputs the analog voltage to a load circuit. A control terminal of the slew rate enhancement circuit is coupled to the digital-to-analog conversion circuit to receive a control voltage following the analog voltage. The slew rate enhancement circuit is further coupled to the output terminal of the digital-to-analog conversion circuit. The slew rate enhancement circuit enhances a slew rate at the output terminal of the digital-to-analog conversion circuit based on the control voltage.

According to an exemplary embodiment of the disclosure, the operation method includes the following. A digital code is converted into an analog voltage by a digital-to-analog conversion circuit of a digital-to-analog conversion device. An output terminal of the digital-to-analog conversion circuit outputs the analog voltage to a load circuit. The output terminal of the digital-to-analog conversion circuit is coupled to a slew rate enhancement circuit of the digital-to-analog conversion device. A slew rate at the output terminal of the digital-to-analog conversion circuit is enhanced by the slew rate enhancement circuit based on a control voltage following the analog voltage.

Based on the above, according to the exemplary embodiments of the disclosure, the digital-to-analog conversion circuit not only converts the digital code into the analog voltage but also provides the control voltage following the analog voltage to the slew rate enhancement circuit. When the output terminal of the digital-to-analog conversion circuit is in a state of transition, the slew rate enhancement circuit may instantly provide a current to the output terminal of the digital-to-analog conversion circuit (and/or instantly draw a current from the output terminal of the digital-to-analog conversion circuit) based on the control voltage. Therefore, the slew rate enhancement circuit can enhance/improve the slew rate at the output terminal of the digital-to-analog conversion circuit.

In order to make the above and other features of the disclosure more comprehensible, exemplary embodiments are described in detail with reference to the accompanying drawings as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
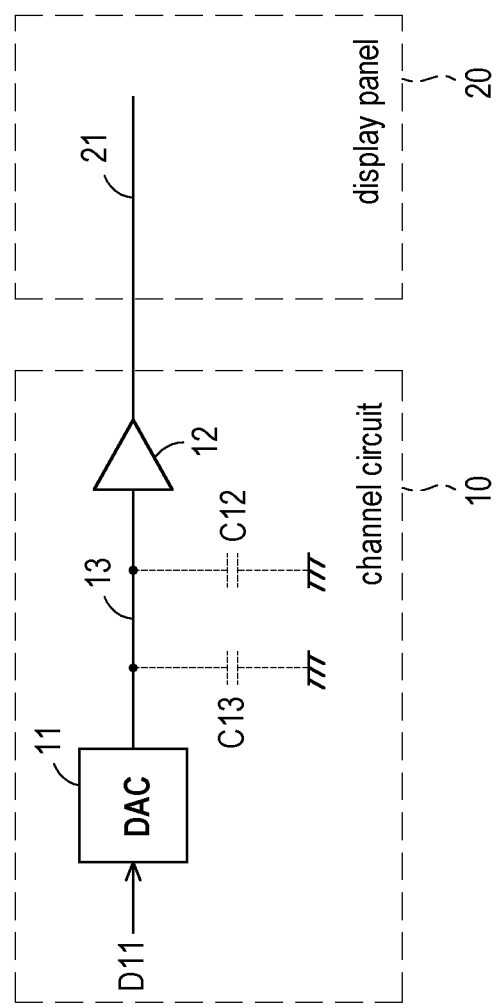
FIG. 1 is a schematic circuit block diagram of a channel circuit of a conventional source driver.

The term "couple (or connect)" used throughout this specification (including the claims) may refer to any direct or indirect connection means. For example, if it is described that a first device is coupled (or connected) to a second device, it should be interpreted that the first device can be directly connected to the second device, or the first device can be indirectly connected to the second device through other devices or some connection means. Terms such as "first" and "second" used throughout this specification (including the claims) are used to name elements or distinguish different embodiments or ranges, and are not used to limit the upper limit or lower limit of the number of elements or limit the order of elements. In addition, where possible, elements/components/steps with the same reference numerals in the drawings and embodiments represent the same or similar parts. Elements/components/steps with the same reference numerals or the same names in different embodiments may serve as reference for each other.

Figure 2:
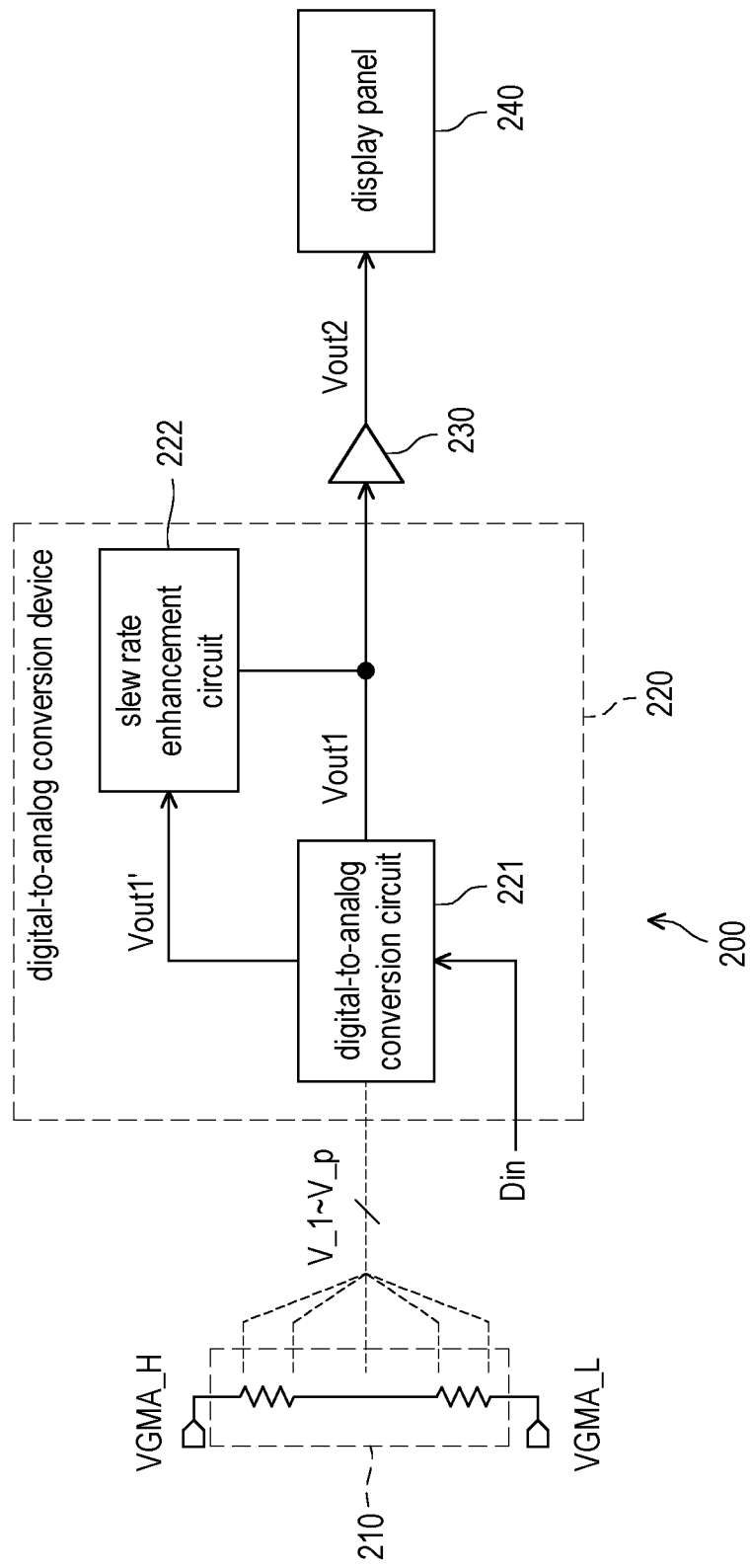
FIG. 2 is a schematic circuit block diagram of a digital-to-analog conversion device according to an embodiment of the disclosure.

FIG. 2 is a schematic circuit block diagram of a digital-to-analog conversion device 220 according to an embodiment of the disclosure. The digital-to-analog conversion device 220 is applicable to any product, for example, a display device 200 shown in FIG. 2. The digital-to-analog conversion device 220 and an output buffer 230 shown in FIG. 2 may serve as one of a plurality of channel circuits of a source driver of the display device 200. The output terminal of the digital-to-analog conversion device 220 is coupled to the input terminal of the output buffer 230. The digital-to-analog conversion device 220 may convert a digital code Din into an analog voltage Vout1, and output the analog voltage Vout1 to the output buffer 230 (load circuit). The output terminal of the output buffer 230 is coupled to a data line of a display panel 240. The output buffer 230 may output a driving signal Vout2 corresponding to the analog voltage Vout1 to the data line (not shown) of the display panel 240.

In the embodiment shown in FIG. 2, the digital-to-analog conversion device 220 includes a digital-to-analog conversion circuit 221 and a slew rate enhancement circuit 222. The digital-to-analog conversion circuit 221 is adapted to be coupled to a resistor string 210 to receive a plurality of gray-scale voltages V_1 to V_p. The number p of the gray-scale voltages V_1 to V_p may be any integer determined according to the actual design. The first terminal and the second terminal of the resistor string 210 are respectively coupled to a first gamma voltage VGMA_H and a second gamma voltage VGMA_L. The resistor string 210 may divide the first gamma voltage VGMA_H and the second gamma voltage VGMA_L to generate the gray-scale voltages V_1 to V_p. The digital-to-analog conversion circuit 221 may convert the digital code Din into the analog voltage Vout1. For example, the digital-to-analog conversion circuit 221 may select one corresponding gray-scale voltage from the gray-scale voltages V_1 to V_p as the analog voltage Vout1 according to the digital code Din.

Figure 3:
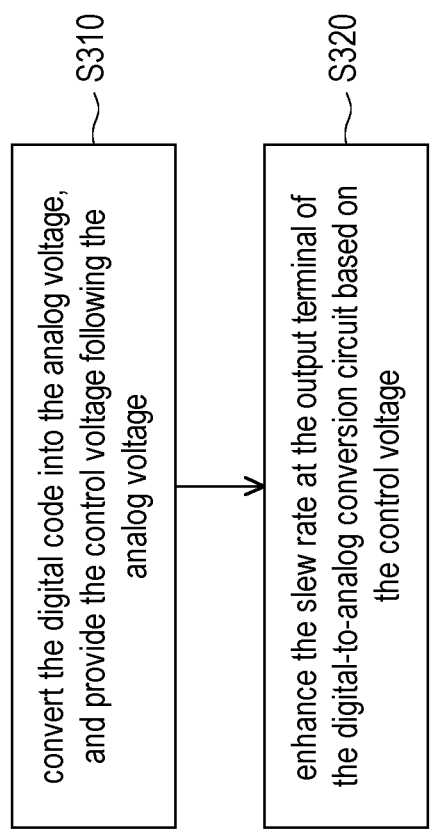
FIG. 3 is a schematic flowchart of an operation method of a digital-to-analog conversion device according to an embodiment of the disclosure.

FIG. 3 is a schematic flowchart of an operation method of a digital-to-analog conversion device according to an embodiment of the disclosure. In step S310, the digital-to-analog conversion circuit 221 may convert the digital code Din into the analog voltage Vout1. The output terminal of the digital-to-analog conversion circuit 221 outputs the analog voltage Vout1 to the load circuit (for example, the output buffer 230). In addition, the digital-to-analog conversion circuit 221 may also provide a control voltage Vout1' following the analog voltage Vout1 to the slew rate enhancement circuit 222. In some application examples, the level of the control voltage Vout1' is different from the level of the analog voltage Vout1. In some embodiments, the voltage difference between the control voltage Vout1' and the analog voltage Vout1 may be a fixed value determined according to the actual design. For example, the voltage difference between the control voltage Vout1' and the analog voltage Vout1 may be close to a transistor threshold voltage. Alternatively, the voltage difference between the control voltage Vout1' and the analog voltage Vout1 may be any fixed value greater than or equal to 0 volt and less than or equal to the transistor threshold voltage.

In other embodiments, the voltage difference between the control voltage Vout1' and the analog voltage Vout1 may be a dynamic value. For example (but not limited to), the voltage difference between the control voltage Vout1' and the analog voltage Vout1 may be any dynamic value greater than or equal to 0 volt and less than or equal to the transistor threshold voltage. The voltage difference between the control voltage Vout1' and the analog voltage Vout1 may change following the analog voltage Vout1 (or the digital code Din) so as to offset the influence of the body effect on the slew rate enhancement circuit 222. For example, in some embodiments, the voltage difference between the control voltage Vout1' and the analog voltage Vout1 may increase as the analog voltage Vout1 (or the digital code Din) increases.

The control terminal of the slew rate enhancement circuit 222 is coupled to the digital-to-analog conversion circuit 221 to receive the control voltage Vout1'. The slew rate enhancement circuit 222 is further coupled to the output terminal of the digital-to-analog conversion circuit 221. In step S320, the slew rate enhancement circuit 222 may enhance the slew rate at the output terminal (the analog voltage Vout1) of the digital-to-analog conversion circuit 221 based on the control voltage Vout1'. For example, when the digital-to-analog conversion circuit 221 raises the analog voltage Vout1 from a low voltage to a high voltage, the slew rate enhancement circuit 222 may provide an additional current to the output terminal of the digital-to-analog conversion circuit 221 during the transition of the analog voltage Vout1 to accelerate the raising of the analog voltage Vout1. When the digital-to-analog conversion circuit 221 lowers the analog voltage Vout1 from a high voltage to a low voltage, the slew rate enhancement circuit 222 may draw an additional current from the output terminal of the digital-to-analog conversion circuit 221 during the transition of the analog voltage Vout1 to accelerate the lowering of the analog voltage Vout1.

Figure 4:
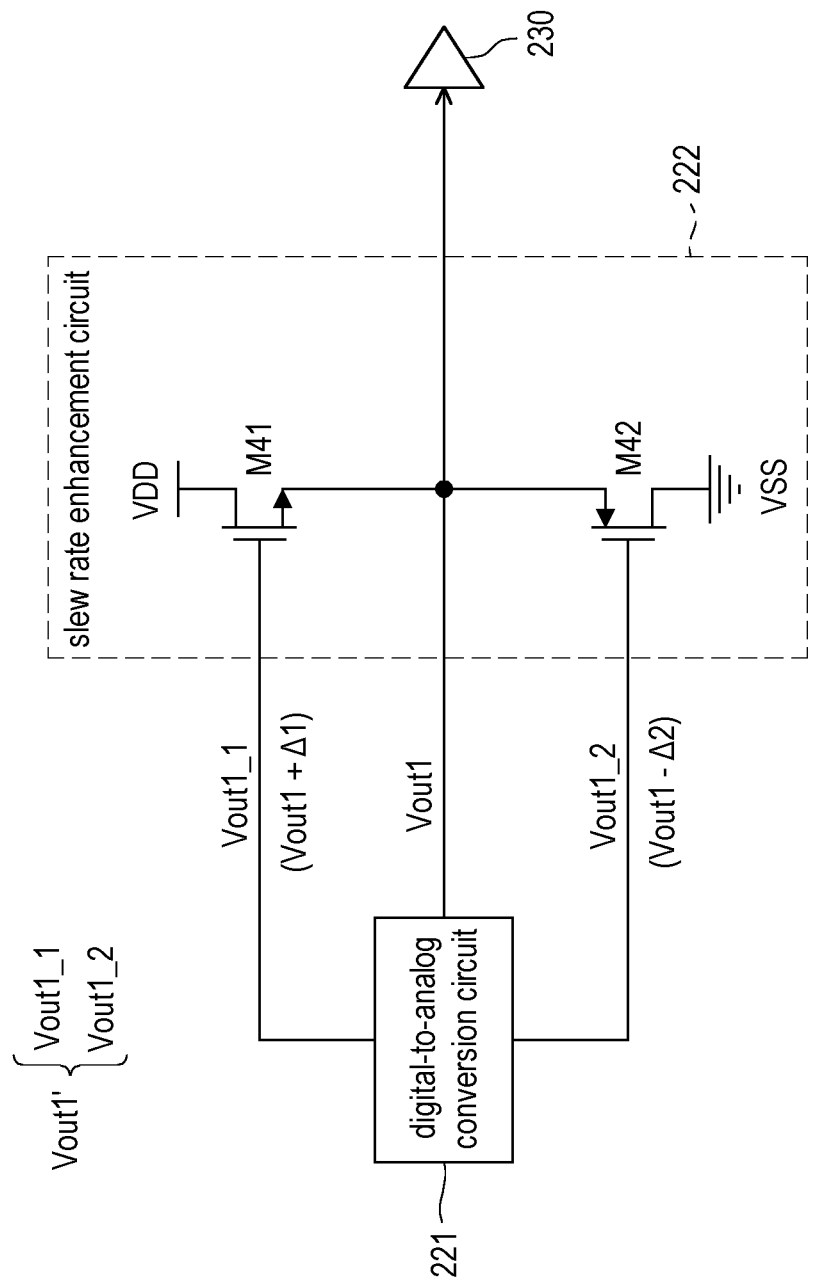
FIG. 4 is a schematic circuit diagram of a slew rate enhancement circuit according to an embodiment of the disclosure.

FIG. 4 is a schematic circuit diagram of the slew rate enhancement circuit 222 according to an embodiment of the disclosure. Details of the digital-to-analog conversion circuit 221, the slew rate enhancement circuit 222, and the output buffer 230 (load circuit) shown in FIG. 4 may be found in the descriptions of the digital-to-analog conversion circuit 221, the slew rate enhancement circuit 222, and the output buffer 230 shown in FIG. 2, and thus will not be repeated here. In the embodiment shown in FIG. 4, the control voltage Vout1' includes a control voltage Vout1_1 and a control voltage Vout1_2 following the analog voltage Vout1, and the slew rate enhancement circuit 222 includes a transistor M41 and a transistor M42. The control terminal (for example, gate) of the transistor M41 is coupled to the digital-to-analog conversion circuit 221 to receive the control voltage Vout1_1. The control terminal (for example, gate) of the transistor M42 is coupled to the digital-to-analog conversion circuit 221 to receive the control voltage Vout1_2.

In the embodiment shown in FIG. 4, the level of the control voltage Vout1_1 may be the rated level of the analog voltage Vout1 (the target level, that is, the level when the analog voltage Vout1 is in the steady state) plus the voltage difference Δ1 so that the control voltage Vout1_1 is greater than the analog voltage Vout1 in the steady state. The level of the control voltage Vout1_2 may be the rated level of the analog voltage Vout1 minus the voltage difference Δ2 so that the control voltage Vout1_2 is less than the analog voltage Vout1 in the steady state. The voltage differences Δ1 and Δ2 may be fixed or dynamic values determined according to the actual design. For example, the voltage difference Δ1 may be close to the threshold voltage of the transistor M41, and the voltage difference Δ2 may be close to the threshold voltage of the transistor M42. Alternatively, the voltage difference Δ1 and/or Δ2 may be any value greater than or equal to 0 volt and less than or equal to the transistor threshold voltage. In some embodiments, the voltage difference Δ1 and/or Δ2 may change following the analog voltage Vout1 (or the digital code Din) to offset the influence of the body effect on the transistor M41 and/or M42. For example, when the analog voltage Vout1 (or the digital code Din) increases, the voltage difference Δ1 and/or Δ2 may increase accordingly. When the analog voltage Vout1 (or the digital code Din) decreases, the voltage difference Δ1 and/or Δ2 may decrease accordingly.

The first terminal (for example, source) of the transistor M41 is coupled to the output terminal of the digital-to-analog conversion circuit 221. The second terminal (for example, drain) of the transistor M41 is coupled to a first voltage source to receive a power supply voltage VDD. The first terminal (for example, source) of the transistor M42 is coupled to the output terminal of the digital-to-analog conversion circuit 221. The second terminal (for example, drain) of the transistor M42 is coupled to a second voltage source to receive a reference voltage VSS.

When the digital-to-analog conversion circuit 221 raises the analog voltage Vout1 from a low voltage to a high voltage, because the analog voltage Vout1 has not yet risen to the rated level (target level) during the transition, the transistor M41 may be turned on during the transition of the analog voltage Vout1 to provide an additional current to the output terminal of the digital-to-analog conversion circuit 221, thereby accelerating the raising of the analog voltage Vout1. The transistor M42 is turned off during the transition of the analog voltage Vout1. When the transition ends and the analog voltage Vout1 is in the steady state, the transistors M41 and M42 are both turned off.

When the digital-to-analog conversion circuit 221 lowers the analog voltage Vout1 from a high voltage to a low voltage, because the analog voltage Vout1 has not yet dropped to the rated level (target level) during the transition, the transistor M42 may be turned on during the transition of the analog voltage Vout1 to draw an additional current from the output terminal of the digital-to-analog conversion circuit 221, thereby accelerating the lowering of the analog voltage Vout1. The transistor M41 is turned off during the transition of the analog voltage Vout1. When the transition ends and the analog voltage Vout1 is in the steady state, the transistors M41 and M42 are both turned off.

Figure 5:
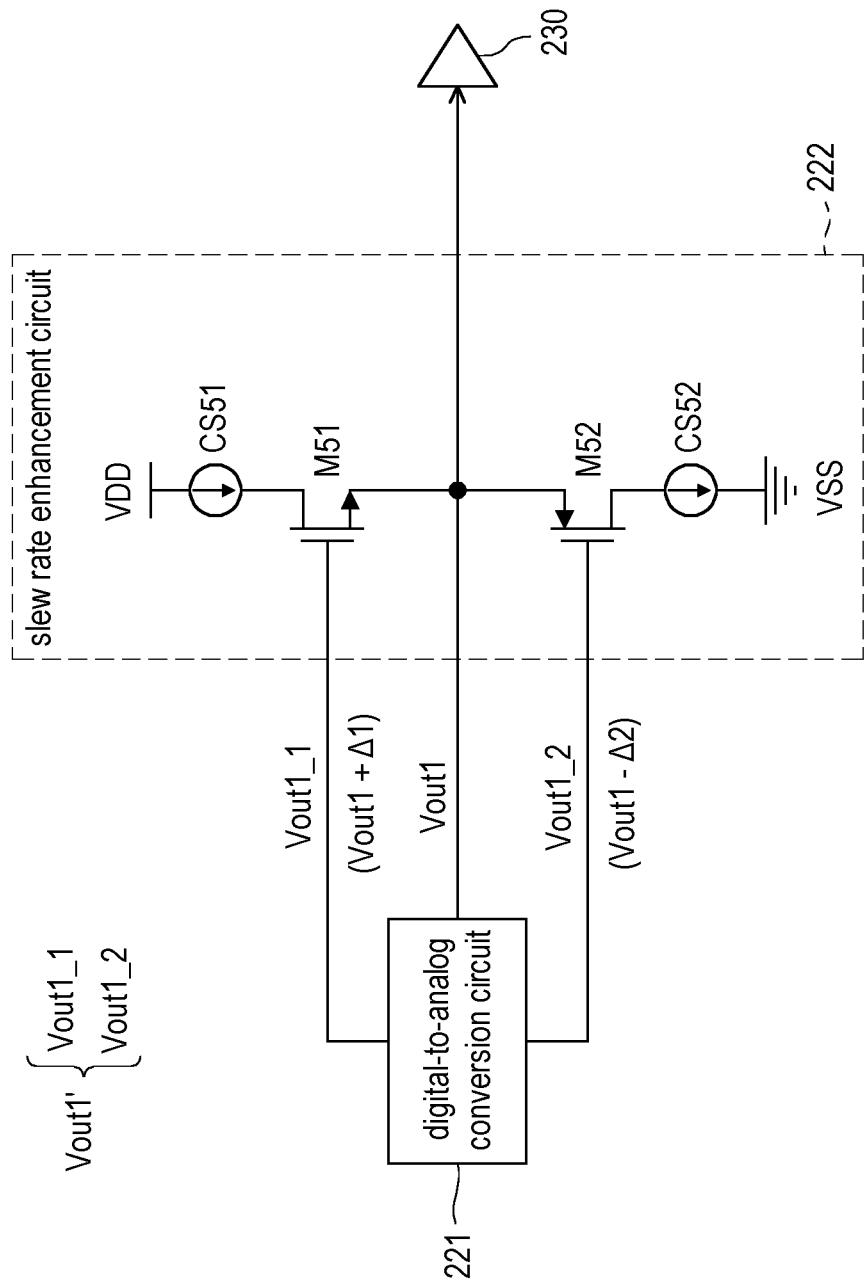
FIG. 5 is a schematic circuit diagram of a slew rate enhancement circuit according to another embodiment of the disclosure.

FIG. 5 is a schematic circuit diagram of the slew rate enhancement circuit 222 according to another embodiment of the disclosure. Details of the digital-to-analog conversion circuit 221, the slew rate enhancement circuit 222, and the output buffer 230 (load circuit) shown in FIG. 5 may be found in the descriptions of the digital-to-analog conversion circuit 221, the slew rate enhancement circuit 222, and the output buffer 230 shown in FIG. 2, and thus will not be repeated here. In the embodiment shown in FIG. 5, the control voltage Vout1' includes a control voltage Vout1_1 and a control voltage Vout1_2 following the analog voltage Vout1, and the slew rate enhancement circuit 222 includes a current source CS51, a transistor M51, a transistor M52, and a current source CS52. Details of the transistors M51 and M52 shown in FIG. 5 may be found in the descriptions of the transistors M41 and M42 shown in FIG. 4, and thus will not be repeated here. In the embodiment shown in FIG. 5, the first terminals (for example, sources) of the transistors M51 and M52 are coupled to the output terminal of the digital-to-analog conversion circuit 221, and the second terminals (for example, drains) of the transistors M51 and M52 are respectively coupled to the current sources CS51 and CS52. The current sources CS51 and CS52 may limit the peak currents of the transistors M51 and M52.

Figure 6:
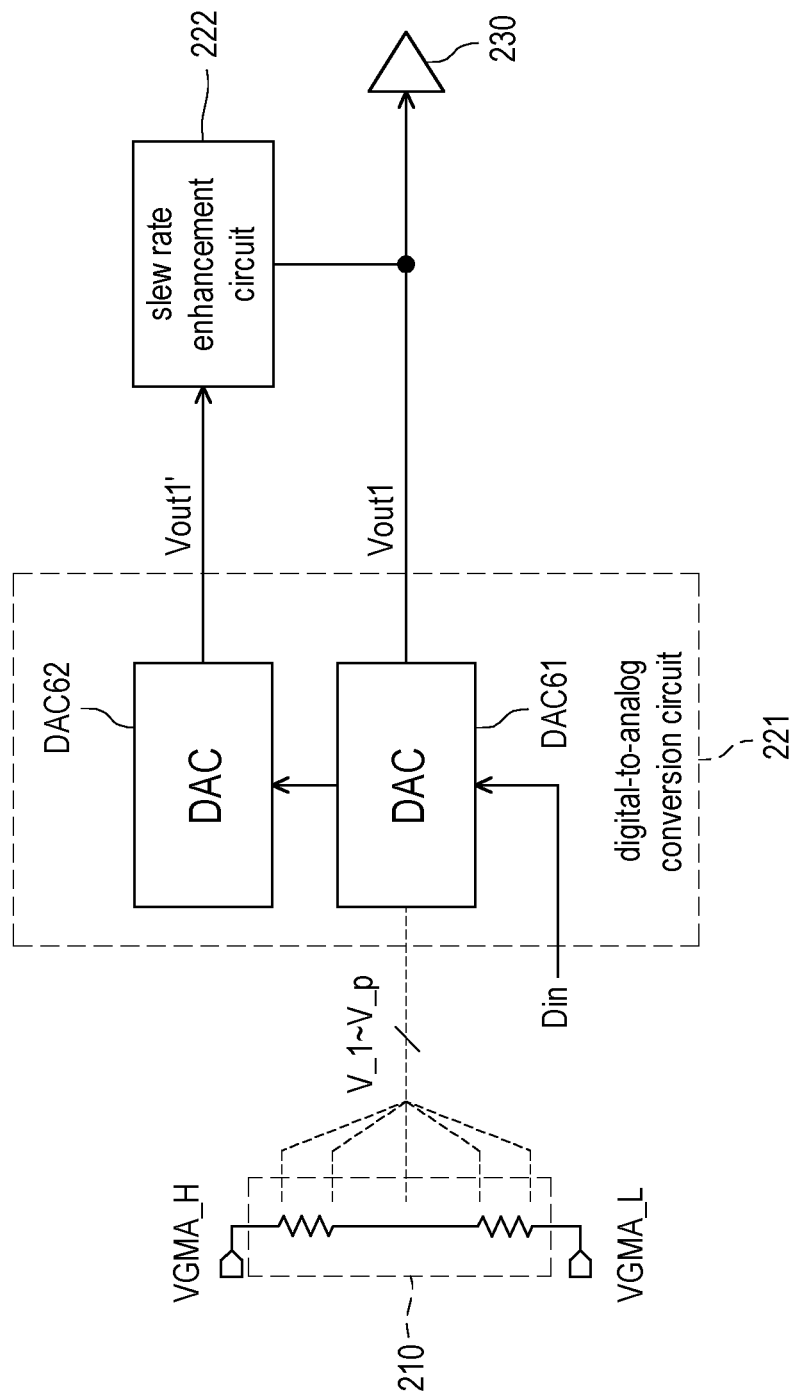
FIG. 6 is a schematic circuit block diagram of a digital-to-analog conversion circuit according to an embodiment of the disclosure.

FIG. 6 is a schematic circuit block diagram of the digital-to-analog conversion circuit 221 according to an embodiment of the disclosure. Details of the resistor string 210, the digital-to-analog conversion circuit 221, the slew rate enhancement circuit 222, and the output buffer 230 (load circuit) shown in FIG. 6 may be found in the descriptions of the resistor string 210, the digital-to-analog conversion circuit 221, the slew rate enhancement circuit 222, and the output buffer 230 shown in FIG. 2, and thus will not be repeated here. In the embodiment shown in FIG. 6, the digital-to-analog conversion circuit 221 includes a digital-to-analog converter (DAC) DAC61 and a DAC DAC62. The DAC DAC61 is adapted to be coupled to the resistor string 210 to receive a plurality of gray-scale voltages V_1 to V_p. The DAC DAC61 may select a first corresponding gray-scale voltage from the gray-scale voltages V_1 to V_p as the analog voltage Vout1 according to the digital code Din. The DAC DAC62 is adapted to be coupled to the resistor string 210 to receive the gray-scale voltages V_1 to V_p. The DAC DAC62 may select one or more second corresponding gray-scale voltages from the gray-scale voltages V_1 to V_p as the control voltage Vout1' according to the digital code Din.

Figure 7:
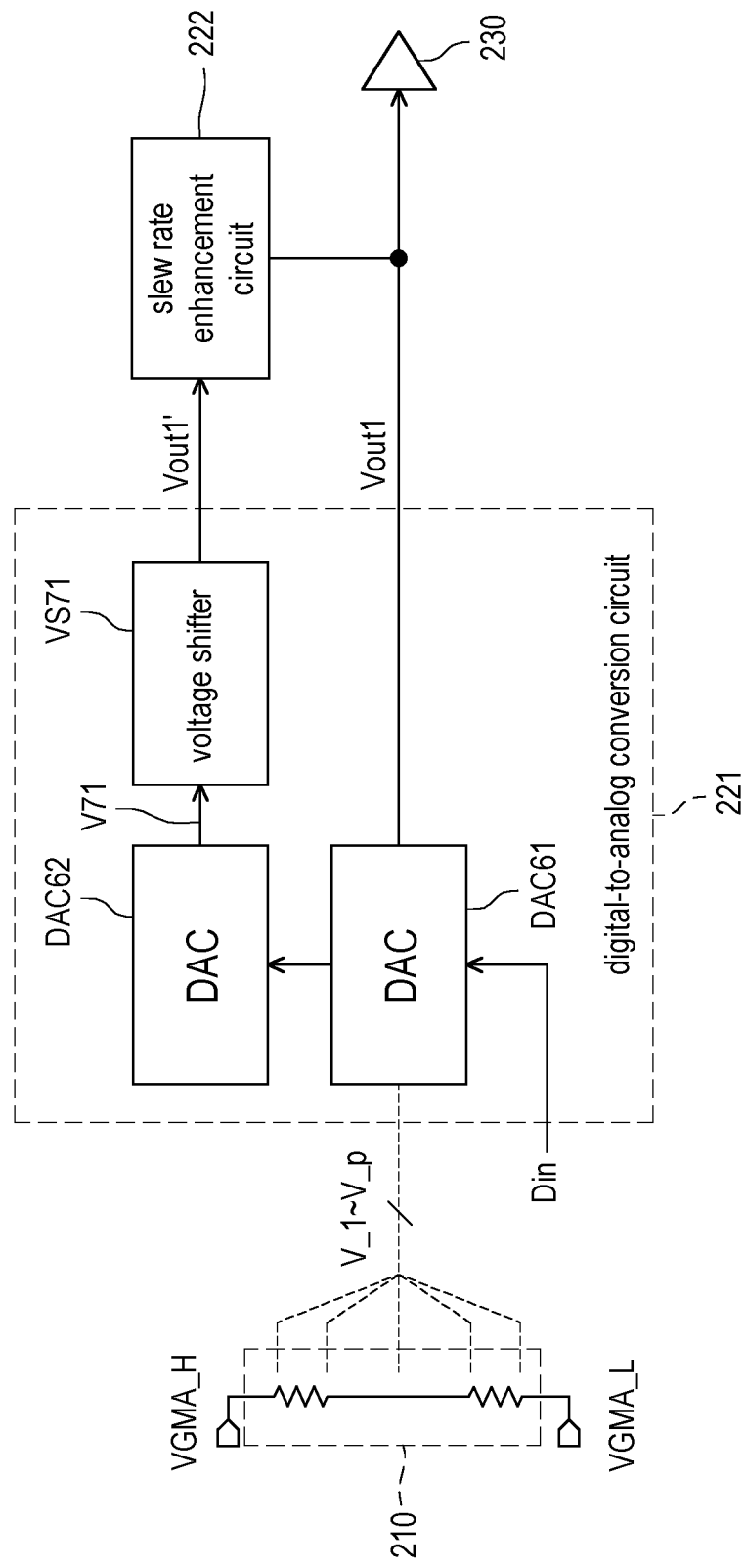
FIG. 7 is a schematic circuit block diagram of a digital-to-analog conversion circuit according to another embodiment of the disclosure.

FIG. 7 is a schematic circuit block diagram of the digital-to-analog conversion circuit 221 according to another embodiment of the disclosure. Details of the resistor string 210, the digital-to-analog conversion circuit 221, the slew rate enhancement circuit 222, and the output buffer 230 (load circuit) shown in FIG. 7 may be found in the descriptions of the resistor string 210, the digital-to-analog conversion circuit 221, the slew rate enhancement circuit 222, and the output buffer 230 shown in FIG. 2, and thus will not be repeated here. In the embodiment shown in FIG. 7, the digital-to-analog conversion circuit 221 includes a DAC DAC61, a DAC DAC62, and a voltage shifter VS71. Details of the DACs DAC61 and DAC62 shown in FIG. 7 may be found in the descriptions of the DACs DAC61 and DAC62 shown in FIG. 6, and thus will not be repeated here.

In the embodiment shown in FIG. 7, the DAC DAC62 selects one corresponding gray-scale voltage V71 from the plurality of gray-scale voltages V_1 to V_p according to the digital code Din. The voltage shifter VS71 is coupled to the DAC DAC62 to receive the corresponding gray-scale voltage V71. The voltage shifter VS71 may generate the control voltage Vout1' according to the corresponding gray-scale voltage V71.

Figure 8:
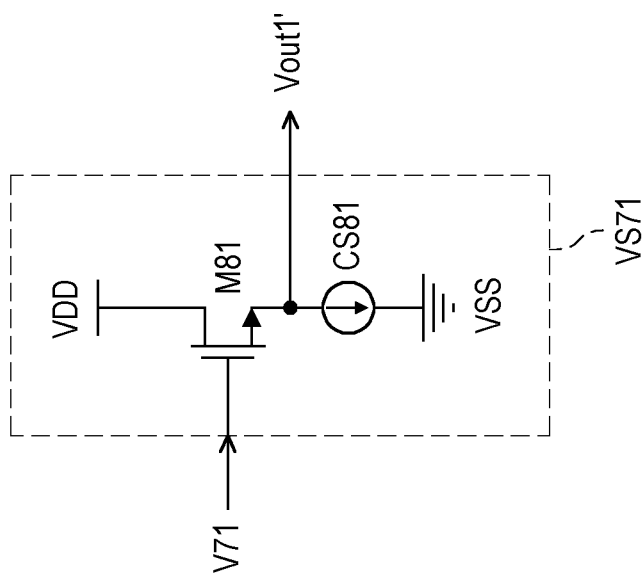
FIG. 8 is a schematic circuit diagram of a voltage shifter according to an embodiment of the disclosure.

FIG. 8 is a schematic circuit diagram of the voltage shifter VS71 according to an embodiment of the disclosure. Details of the voltage shifter VS71 shown in FIG. 8 may be found in the descriptions of the voltage shifter VS71 shown in FIG. 7, and thus will not be repeated here. In the embodiment shown in FIG. 8, the voltage shifter VS71 includes a transistor M81 and a current source CS81. The control terminal (for example, gate) of the transistor M81 is coupled to the DAC DAC62 to receive the corresponding gray-scale voltage V71. The first terminal (for example, source) of the transistor M81 is coupled to the current source CS81. The second terminal (for example, drain) of the transistor M81 is coupled to the voltage source to receive the power supply voltage VDD.

The voltage at the first terminal of the transistor M81 may serve as the control voltage Vout1' (for example, as the control voltage Vout1_2 shown in FIG. 4 or FIG. 5). In the embodiment shown in FIG. 8, the level of the control voltage Vout1' may be the level of the corresponding gray-scale voltage V71 minus the threshold voltage of the transistor M81 so that the control voltage Vout1' is less than the analog voltage Vout1 in the steady state. In the case where the transistor M81 is a single transistor, the threshold voltage of the transistor M81 is not adjustable. According to the actual design, in some embodiments, the threshold voltage of the transistor M81 is adjustable so as to adjust the voltage difference between the control voltage Vout1' and the corresponding gray-scale voltage V71. The threshold voltage of the transistor M81 may increase as the digital code Din increases. For example, the transistor M81 may be an assembly of multiple sub-transistors. These sub-transistors may be connected in series or in parallel with one another. Based on the control of the digital code Din over these sub-transistors, the equivalent aspect ratio (that is, the channel aspect ratio) of the transistor M81 may be adjusted. When the equivalent aspect ratio of the transistor M81 increases, the threshold voltage of the transistor M81 decreases so that the voltage difference between the control voltage Vout1' and the corresponding gray-scale voltage V71 decreases, and vice versa.

According to the actual design, in some embodiments, the current source CS81 may be a constant current source. In other embodiments, the current source CS81 may be a variable current source. The current of the current source CS81 may increase as the digital code Din increases. When the current of the current source CS81 increases, the voltage difference between the control voltage Vout1' and the corresponding gray-scale voltage V71 increases, and vice versa.

Figure 9:
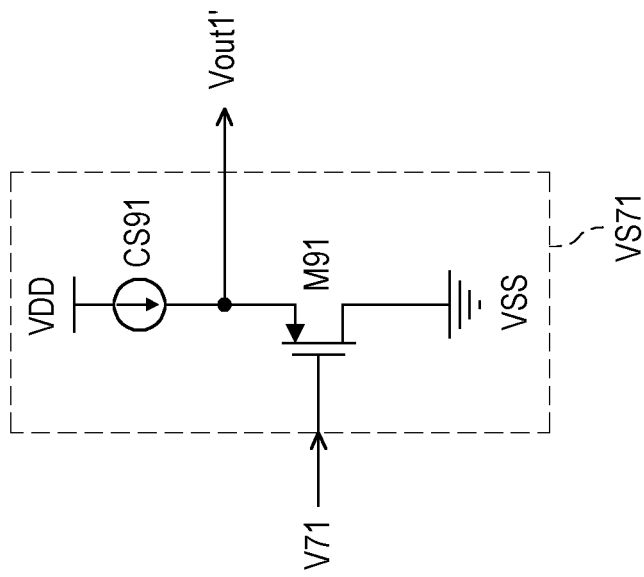
FIG. 9 is a schematic circuit diagram of a voltage shifter according to another embodiment of the disclosure.

FIG. 9 is a schematic circuit diagram of the voltage shifter VS71 according to another embodiment of the disclosure. Details of the voltage shifter VS71 shown in FIG. 9 may be found in the descriptions of the voltage shifter VS71 shown in FIG. 7, and thus will not be repeated here. In the embodiment shown in FIG. 9, the voltage shifter VS71 includes a current source CS91 and a transistor M91. Details of the current source CS91 and the transistor M91 shown in FIG. 9 may be found in the descriptions of the current source CS81 and the transistor M81 shown in FIG. 8, and thus will not be repeated here.

In the embodiment shown in FIG. 9, the control terminal (for example, gate) of the transistor M91 is coupled to the DAC DAC62 to receive the corresponding gray-scale voltage V71. The first terminal (for example, source) of the transistor M91 is coupled to the current source CS91. The second terminal (for example, drain) of the transistor M91 is coupled to the voltage source to receive the reference voltage VSS. The voltage at the first terminal of the transistor M91 may serve as the control voltage Vout1' (for example, as the control voltage Vout1_1 shown in FIG. 4 or FIG. 5). In the embodiment shown in FIG. 9, the level of the control voltage Vout1' may be the level of the corresponding gray-scale voltage V71 plus the threshold voltage of the transistor M91 so that the control voltage Vout1' is greater than the analog voltage Vout1 in the steady state.

Figure 10:
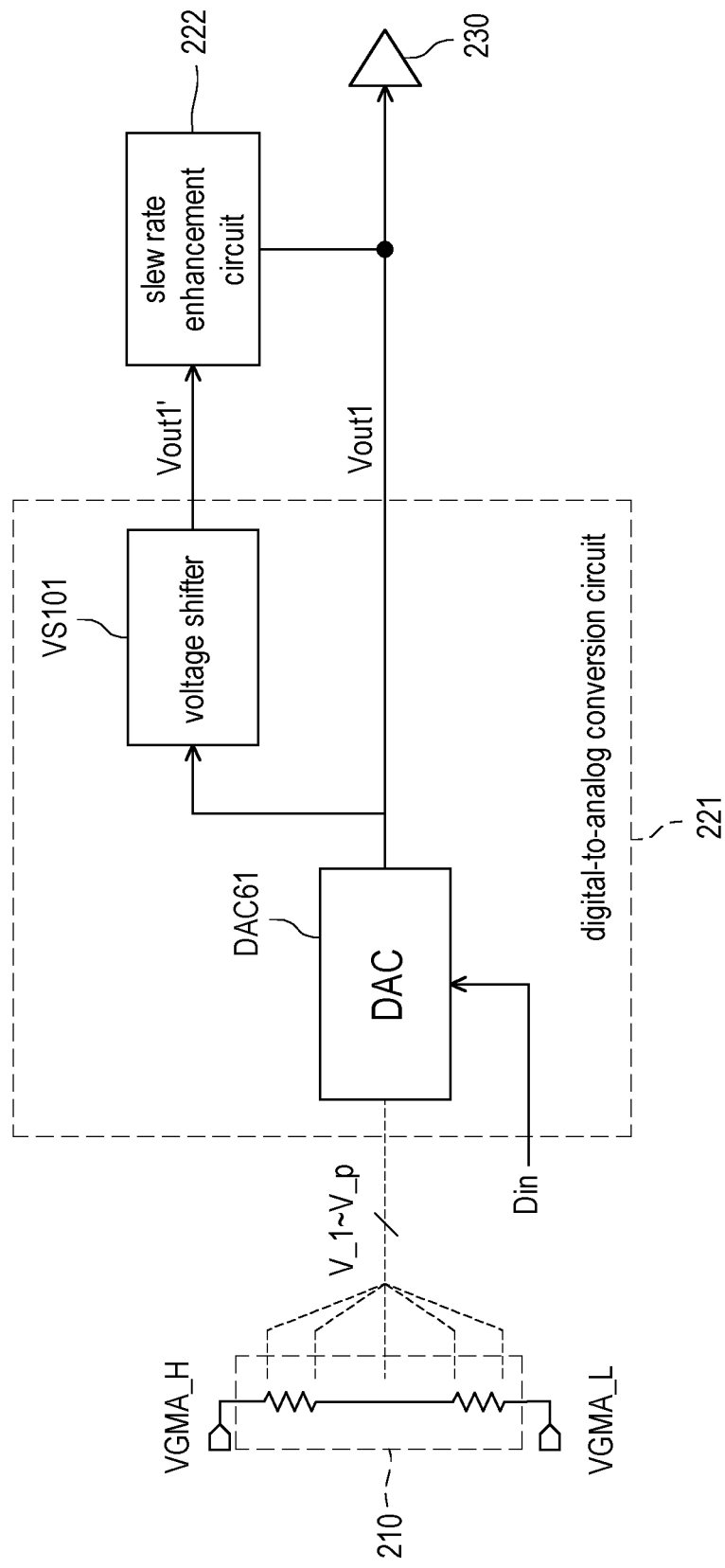
FIG. 10 is a schematic circuit block diagram of a digital-to-analog conversion circuit according to yet another embodiment of the disclosure.

FIG. 10 is a schematic circuit block diagram of the digital-to-analog conversion circuit 221 according to yet another embodiment of the disclosure. Details of the resistor string 210, the digital-to-analog conversion circuit 221, the slew rate enhancement circuit 222, and the output buffer 230 (load circuit) shown in FIG. 10 may be found in the descriptions of the resistor string 210, the digital-to-analog conversion circuit 221, the slew rate enhancement circuit 222, and the output buffer 230 shown in FIG. 2, and thus will not be repeated here. In the embodiment shown in FIG. 10, the digital-to-analog conversion circuit 221 includes a DAC DAC61 and a voltage shifter VS101. Details of the DAC DAC61 shown in FIG. 10 may be found in the descriptions of the DAC DAC61 shown in FIG. 7, and thus will not be repeated here.

Details of the voltage shifter VS101 shown in FIG. 10 may be found in the descriptions of the voltage shifter VS71 shown in FIG. 7. In the embodiment shown in FIG. 10, the voltage shifter VS101 is coupled to the output terminal of the DAC DAC61 to receive the analog voltage Vout1. The voltage shifter VS101 may generate the control voltage Vout1' according to the analog voltage Vout1.

Figure 11:
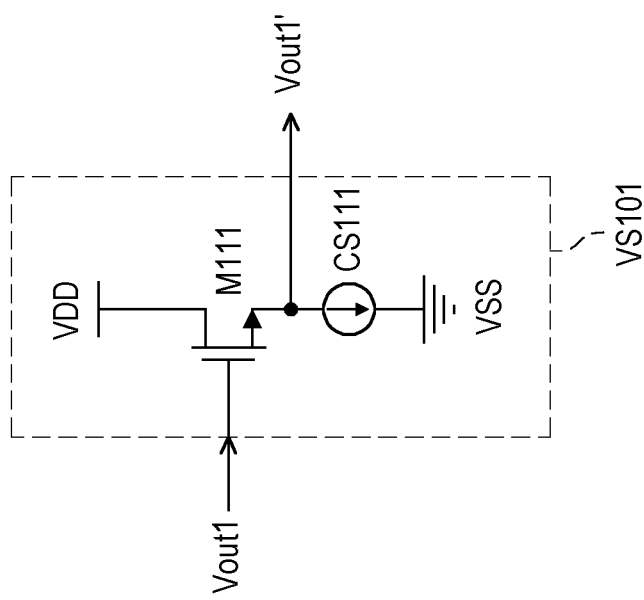
FIG. 11 is a schematic circuit diagram of a voltage shifter according to an embodiment of the disclosure.

FIG. 11 is a schematic circuit diagram of the voltage shifter VS101 according to an embodiment of the disclosure. Details of the voltage shifter VS101 shown in FIG. 11 may be found in the descriptions of the voltage shifter VS101 shown in FIG. 10, and thus will not be repeated here. In the embodiment shown in FIG. 11, the voltage shifter VS101 includes a transistor M111 and a current source CS111. The control terminal (for example, gate) of the transistor M111 is coupled to the DAC DAC61 to receive the analog voltage Vout1. The first terminal (for example, source) of the transistor M111 is coupled to the current source CS111. The second terminal (for example, drain) of the transistor M111 is coupled to the voltage source to receive the power supply voltage VDD.

The voltage at the first terminal of the transistor M111 may serve as the control voltage Vout1' (for example, as the control voltage Vout1_2 shown in FIG. 4 or FIG. 5). In the embodiment shown in FIG. 11, the level of the control voltage Vout1' may be the level of the analog voltage Vout1 minus the threshold voltage of the transistor M111 so that the control voltage Vout1' is less than the analog voltage Vout1 in the steady state. In the case where the transistor M111 is a single transistor, the threshold voltage of the transistor M111 is not adjustable. According to the actual design, in some embodiments, the threshold voltage of the transistor M111 is adjustable so as to adjust the voltage difference between the control voltage Vout1' and the analog voltage Vout1. The threshold voltage of the transistor M111 may increase as the digital code Din increases. For example, the transistor M111 may be an assembly of multiple sub-transistors. These sub-transistors may be connected in series or in parallel with one another. Based on the control of the digital code Din over these sub-transistors, the equivalent aspect ratio (that is, the channel aspect ratio) of the transistor M111 may be adjusted. When the equivalent aspect ratio of the transistor M111 increases, the threshold voltage of the transistor M111 decreases, so that the voltage difference between the control voltage Vout1' and the analog voltage Vout1 decreases, and vice versa.

According to the actual design, in some embodiments, the current source CS111 may be a constant current source. In other embodiments, the current source CS111 may be a variable current source. The current of the current source CS111 may increase as the digital code Din increases. When the current of the current source CS111 increases, the voltage difference between the control voltage Vout1' and the analog voltage Vout1 increases, and vice versa.

Figure 12:
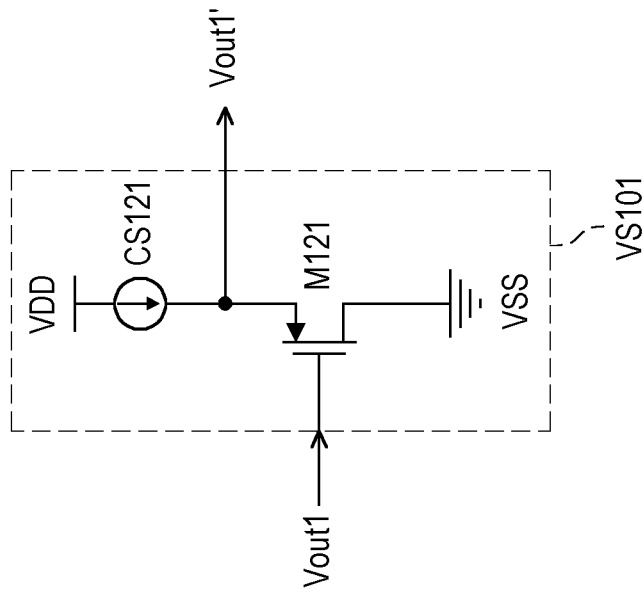
FIG. 12 is a schematic circuit diagram of a voltage shifter according to another embodiment of the disclosure.

FIG. 12 is a schematic circuit diagram of the voltage shifter VS101 according to another embodiment of the disclosure. Details of the voltage shifter VS101 shown in FIG. 12 may be found in the descriptions of the voltage shifter VS101 shown in FIG. 10, and thus will not be repeated here. In the embodiment shown in FIG. 12, the voltage shifter VS101 includes a current source CS121 and a transistor M121. Details of the current source CS121 and the transistor M121 shown in FIG. 12 may be found in the descriptions of the current source CS111 and the transistor M111 shown in FIG. 11.

In the embodiment shown in FIG. 12, the control terminal (for example, gate) of the transistor M121 is coupled to the DAC DAC61 to receive the analog voltage Vout1. The first terminal (for example, source) of the transistor M121 is coupled to the current source CS121. The second terminal (for example, drain) of the transistor M121 is coupled to the voltage source to receive the reference voltage VSS. The voltage at the first terminal of the transistor M121 may serve as the control voltage Vout1' (for example, as the control voltage Vout1_1 shown in FIG. 4 or FIG. 5). In the embodiment shown in FIG. 12, the level of the control voltage Vout1' may be the level of the analog voltage Vout1 plus the threshold voltage of the transistor M121 so that the control voltage Vout1' is greater than the analog voltage Vout1 in the steady state.

To sum up, according to the above embodiments, the digital-to-analog conversion circuit 221 not only converts the digital code Din into the analog voltage Vout1 but also provides the control voltage Vout1' following the analog voltage Vout1 to the slew rate enhancement circuit 222. When the output terminal of the digital-to-analog conversion circuit 221 is in a state of transition, the slew rate enhancement circuit 222 may instantly provide a current to the output terminal of the digital-to-analog conversion circuit (and/or instantly draw a current from the output terminal of the digital-to-analog conversion circuit 221) based on the control voltage Vout1'. Therefore, the slew rate enhancement circuit 222 can enhance/improve the slew rate at the output terminal of the digital-to-analog conversion circuit 221.

Although the disclosure has been described above with reference to the exemplary embodiments, the exemplary embodiments are not intended to limit the disclosure. People having ordinary knowledge in the art can make various changes and modifications without departing from the spirit and scope of the disclosure. Therefore, the protection scope of the disclosure should be defined by the claims.

What is claimed is:

1. A digital-to-analog conversion device, comprising:
   a digital-to-analog conversion circuit configured to convert a digital code into an analog voltage, wherein an output terminal of the digital-to-analog conversion circuit outputs the analog voltage to a load circuit; and
   a slew rate enhancement circuit having a control terminal coupled to the digital-to-analog conversion circuit to receive a control voltage following the analog voltage, wherein the control voltage comprises a first control voltage following the analog voltage, the slew rate enhancement circuit is further coupled to the output terminal of the digital-to-analog conversion circuit, the slew rate enhancement circuit enhances a slew rate at the output terminal of the digital-to-analog conversion circuit based on the control voltage, and the slew rate enhancement circuit comprises:
     a first transistor having a control terminal coupled to the digital-to-analog conversion circuit to receive the first control voltage, wherein a first terminal of the first transistor is coupled to the output terminal of the digital-to-analog conversion circuit, and a second terminal of the first transistor is coupled to a first voltage source.

2. The digital-to-analog conversion device according to claim 1, wherein there is a voltage difference between the control voltage and the analog voltage, and the voltage difference is close to a transistor threshold voltage.

3. The digital-to-analog conversion device according to claim 1, wherein there is a voltage difference between the control voltage and the analog voltage, the voltage difference is greater than or equal to 0 volt, and the voltage difference is less than or equal to a transistor threshold voltage.

4. The digital-to-analog conversion device according to claim 1, wherein there is a voltage difference between the control voltage and the analog voltage, and the voltage difference changes following the analog voltage.

5. The digital-to-analog conversion device according to claim 4, wherein the voltage difference increases as the analog voltage increases.

6. The digital-to-analog conversion device according to claim 1, wherein the control voltage further comprises a second control voltage following the analog voltage, and the slew rate enhancement circuit further comprises:
   a second transistor having a control terminal coupled to the digital-to-analog conversion circuit to receive the second control voltage, wherein a first terminal of the second transistor is coupled to the output terminal of the digital-to-analog conversion circuit, and a second terminal of the second transistor is coupled to a second voltage source.

7. The digital-to-analog conversion device according to claim 6, wherein the first voltage source provides a power supply voltage to the second terminal of the first transistor, the second voltage source provides a reference voltage to the second terminal of the second transistor, the first control voltage is greater than the analog voltage, and the second control voltage is less than the analog voltage.

8. A digital-to-analog conversion device, comprising:
   a digital-to-analog conversion circuit configured to convert a digital code into an analog voltage, wherein an output terminal of the digital-to-analog conversion circuit outputs the analog voltage to a load circuit; and
   a slew rate enhancement circuit having a control terminal coupled to the digital-to-analog conversion circuit to receive a control voltage following the analog voltage, wherein the control voltage comprises a first control voltage following the analog voltage, the slew rate enhancement circuit is further coupled to the output terminal of the digital-to-analog conversion circuit, the slew rate enhancement circuit enhances a slew rate at the output terminal of the digital-to-analog conversion circuit based on the control voltage, and the slew rate enhancement circuit comprises:
  a first transistor having a control terminal coupled to the digital-to-analog conversion circuit to receive the first control voltage, wherein a first terminal of the first transistor is coupled to the output terminal of the digital-to-analog conversion circuit; and
  a first current source coupled to a second terminal of the first transistor.

9. The digital-to-analog conversion device according to claim 8, wherein the control voltage further comprises a second control voltage following the analog voltage, and the slew rate enhancement circuit further comprises:
  a second transistor having a control terminal coupled to the digital-to-analog conversion circuit to receive the second control voltage, wherein a first terminal of the second transistor is coupled to the output terminal of the digital-to-analog conversion circuit; and
  a second current source coupled to a second terminal of the second transistor.

10. The digital-to-analog conversion device according to claim 1, wherein the digital-to-analog conversion circuit is adapted to be coupled to a resistor string to receive a plurality of gray-scale voltages, the resistor string divides a first gamma voltage and a second gamma voltage to generate the gray-scale voltages, and the digital-to-analog conversion circuit selects one corresponding gray-scale voltage from the gray-scale voltages as the analog voltage according to the digital code.

11. The digital-to-analog conversion device according to claim 10, wherein the digital-to-analog conversion circuit comprises:
  a first digital-to-analog converter adapted to be coupled to the resistor string to receive the gray-scale voltages and select a first corresponding gray-scale voltage from the gray-scale voltages as the analog voltage according to the digital code; and
  a second digital-to-analog converter adapted to be coupled to the resistor string to receive the gray-scale voltages and select a second corresponding gray-scale voltage from the gray-scale voltages as the control voltage according to the digital code.

12. The digital-to-analog conversion device according to claim 10, wherein the digital-to-analog conversion circuit comprises:
  a first digital-to-analog converter adapted to be coupled to the resistor string to receive the gray-scale voltages and select a first corresponding gray-scale voltage from the gray-scale voltages as the analog voltage according to the digital code;
  a second digital-to-analog converter adapted to be coupled to the resistor string to receive the gray-scale voltages and select a second corresponding gray-scale voltage from the gray-scale voltages according to the digital code; and
  a voltage shifter, coupled to the second digital-to-analog converter to receive the second corresponding gray-scale voltage, and generating the control voltage according to the second corresponding gray-scale voltage.

13. The digital-to-analog conversion device according to claim 12, wherein the voltage shifter comprises:
  a current source; and
  a transistor having a control terminal coupled to the second digital-to-analog converter to receive the second corresponding gray-scale voltage, wherein a first terminal of the transistor is coupled to the current source, and a second terminal of the transistor is coupled to a voltage source.

14. The digital-to-analog conversion device according to claim 13, wherein a threshold voltage of the transistor increases as the digital code increases.

15. The digital-to-analog conversion device according to claim 13, wherein a current of the current source increases as the digital code increases.

16. The digital-to-analog conversion device according to claim 1, wherein the digital-to-analog conversion circuit comprises:
  a digital-to-analog converter configured to convert the digital code into the analog voltage; and
  a voltage shifter, coupled to an output terminal of the digital-to-analog converter to receive the analog voltage, and configured to generate the control voltage according to the analog voltage.

17. The digital-to-analog conversion device according to claim 16, wherein the voltage shifter comprises:
  a current source; and
  a transistor having a control terminal coupled to the output terminal of the digital-to-analog converter to receive the analog voltage, wherein a first terminal of the transistor is coupled to the current source, and a second terminal of the transistor is coupled to a voltage source.

18. The digital-to-analog conversion device according to claim 17, wherein a threshold voltage of the transistor increases as the digital code increases.

19. The digital-to-analog conversion device according to claim 17, wherein a current of the current source increases as the digital code increases.

20. An operation method of a digital-to-analog conversion device, comprising:
  converting a digital code into an analog voltage by a digital-to-analog conversion circuit of the digital-to-analog conversion device, wherein an output terminal of the digital-to-analog conversion circuit outputs the analog voltage to a load circuit, and the output terminal of the digital-to-analog conversion circuit is coupled to a slew rate enhancement circuit of the digital-to-analog conversion device; and
  enhancing a slew rate at the output terminal of the digital-to-analog conversion circuit by the slew rate enhancement circuit based on a control voltage following the analog voltage, wherein the control voltage comprises a first control voltage following the analog voltage, the slew rate enhancement circuit comprise a first transistor having a control terminal coupled to the digital-to-analog conversion circuit to receive the first control voltage, a first terminal of the first transistor is coupled to the output terminal of the digital-to-analog conversion circuit, and a second terminal of the first transistor is coupled to a first voltage source.

21. The operation method according to claim 20, wherein there is a voltage difference between the control voltage and the analog voltage, and the voltage difference is close to a transistor threshold voltage.

22. The operation method according to claim 20, wherein there is a voltage difference between the control voltage and the analog voltage, the voltage difference is greater than or equal to 0 volt, and the voltage difference is less than or equal to a transistor threshold voltage.

23. The operation method according to claim 20, wherein there is a voltage difference between the control voltage and the analog voltage, and the voltage difference changes following the analog voltage.

24. The operation method according to claim 23, wherein the voltage difference increases as the analog voltage increases.

\* \* \* \* \*